United States Patent
Cirjean

(10) Patent No.: US 9,226,422 B2
(45) Date of Patent: Dec. 29, 2015

(54) SYSTEM FOR SPREADING A SPECTRUM LINKED TO THE USAGE OF A SWITCHING REGULATOR USED IN A RECEIVER OR DISPLAY OF A DASHBOARD OF AN AUTOMOBILE

(75) Inventor: Jean-Paul Cirjean, Eragny sur Oise (FR)

(73) Assignee: Johnson Controls Automotive Electronics SAS, Cergy-Pontoise (FR)

( * ) Notice: Subject to any disclaimer, the term of this patent is extended or adjusted under 35 U.S.C. 154(b) by 150 days.

(21) Appl. No.: 14/111,501

(22) PCT Filed: Apr. 12, 2012

(86) PCT No.: PCT/EP2012/001579
§ 371 (c)(1),
(2), (4) Date: Dec. 27, 2013

(87) PCT Pub. No.: WO2012/139754
PCT Pub. Date: Oct. 18, 2012

(65) Prior Publication Data
US 2014/0328011 A1   Nov. 6, 2014

(30) Foreign Application Priority Data

Apr. 13, 2011  (DE) .......................... 10 2011 016 919
Jun. 8, 2011   (FR) ...................................... 11 01755

(51) Int. Cl.
| | |
|---|---|
| *H05K 7/02* | (2006.01) |
| *H02M 1/44* | (2007.01) |
| *H04B 15/06* | (2006.01) |
| *H04B 15/00* | (2006.01) |
| *H05B 33/08* | (2006.01) |

(52) U.S. Cl.
CPC . *H05K 7/02* (2013.01); *H02M 1/44* (2013.01); *H04B 15/005* (2013.01); *H04B 15/06* (2013.01); *H05B 33/0815* (2013.01)

(58) Field of Classification Search
CPC ........... H05K 7/02; H02M 1/44; H04B 15/06; H04B 15/005; H05B 33/0815
USPC ......................................... 323/271, 282–288
See application file for complete search history.

(56) References Cited

U.S. PATENT DOCUMENTS

| | | | |
|---|---|---|---|
| 4,188,585 A | 2/1980 | Wissel et al. | |
| 6,366,067 B1 * | 4/2002 | Zhang ................ | H02M 3/1584 323/282 |

(Continued)

FOREIGN PATENT DOCUMENTS

| | | |
|---|---|---|
| CN | 201557091 U | 8/2010 |
| EP | 1 592 154 A2 | 11/2005 |
| EP | 1 592 154 A3 | 11/2005 |

OTHER PUBLICATIONS

Sagneri, Feb. 2007, MIT, MS Thesis, 1-169.*

(Continued)

*Primary Examiner* — Jue Zhang
(74) *Attorney, Agent, or Firm* — Foley & Lardner LLP

(57) ABSTRACT

An arrangement of electronic components is to be used with a switching regulator, in particular is to be used in a receiver or display of an automobile dashboard. The switching regulator includes a first oscillator having a first frequency. The electronic component arrangement is provided so as to be connected to a voltage source, the voltage source supplying a periodical voltage having a second frequency, wherein the second frequency is lower than the first frequency. The electronic component arrangement includes a first resistor, a first capacitor, a second resistor, a second capacitor, a third resistor, and at least a third capacitor.

5 Claims, 2 Drawing Sheets

(56) References Cited

U.S. PATENT DOCUMENTS

| | | | | |
|---|---|---|---|---|
| 7,504,810 B1* | 3/2009 | Tagare | ............... | H02M 1/44 323/282 |
| 2009/0174338 A1 | 7/2009 | Muramatsu | | |
| 2011/0012575 A1* | 1/2011 | Midya | ............... | H02M 3/156 323/282 |

OTHER PUBLICATIONS

International Search mailed Oct. 5, 2012 as received in corresponding International Application No. PCT/EP2012/001579.

Texas Instruments Incorporated: "Economy 1.7, 9 Primary Side Controller," Nov. 1, 1999, pages 1-8, XP002683529, Retrieved from the Internet: URL:http://www.ti.com/lit/ds/symlink/ucc2809-1.pdf. [retrieved on Sep. 14, 2012]figure 1.5.

Texas Instruments Incorporated: "4.5-V TO 52-V Input Current Mode Boost Controller," Mar. 1, 2008, pp. 1-19, XP002683530,Retrieved from the Internet: URL:http://www.ti.com/product/tps40210, [retrieved on Sep. 14, 2012] pp. 3, 11, 13.

International Preliminary Report on Patentability and Written Opinion in PCT/EP2012/001579 dated Oct. 24, 2013, 10 pages.

Office Action dated Aug. 12, 2015, in corresponding Chinese application No. 201280027804.X and English translation, 19 pages.

\* cited by examiner

SYSTEM FOR SPREADING A SPECTRUM LINKED TO THE USAGE OF A SWITCHING REGULATOR USED IN A RECEIVER OR DISPLAY OF A DASHBOARD OF AN AUTOMOBILE

CROSS REFERENCE TO RELATED APPLICATIONS

The present application is a U.S. National Stage of International Application No. PCT/EP2012/001579, filed on Apr. 12, 2012, which claims the benefit of German Patent Application No. 10 2011 016 919.9, filed on Apr. 13, 2011, and French Patent Application No. 11/01755, filed Jun. 8, 2011, the entire disclosures of all of which are incorporated herein by reference.

The present invention relates to a spectrum spreading system linked to the use of a switching regulator used in a motor vehicle dashboard handset or display. This system, consisting of an arrangement of electronic components is connected to a switching regulator.

In the prior art, switching regulators (also called switching converters or DC-DC converters) are known for supplying a certain voltage or a certain current to one or more electronic elements. The switching regulator comprises at least one energy storage device, such as, for example, an inductor, and at least one switch that can be switched periodically which is typically produced using a transistor or several transistors. Typically, an oscillator supplies a switching frequency to the switching regulator, this switching frequency normally being of the order of several hundred kHz, that is to say, in the high frequency (or radio frequency) domain.

The high switching frequency can lead to the generation of high frequency noises in the voltage source and to the emission of electromagnetic waves which can interfere with other neighboring components or elements, and, consequently, cause such neighboring electronic components or elements to operate poorly. Notably transmission by electromagnetic waves (notably in the radio frequency domain) can be disrupted.

Consequently, and as a general rule, electronic components or elements have to conform to very high demands, notably prescribed by public authorities, which define limit values regarding the emission of electromagnetic waves.

In the prior art, frequency filters are known which can eliminate (or suppress) the high frequency parts of a signal, notably to reduce the emission of spurious electromagnetic waves.

The aim of the present invention is notably to mitigate the drawbacks of the prior art, and notably those cited above, and also to propose an improved, arrangement of electronic components, the arrangement of electronic components being intended for use with a switching regulator, to thus reduce the negative effects caused by the emissions of the spurious electromagnetic waves on the electronic components or elements.

According to the invention, this aim is achieved by an arrangement of electronic components for use with a switching regulator, notably for use in a motor vehicle dashboard, the switching regulator comprising a first oscillator having a first frequency, the arrangement of electronic components being designed to be linked to a voltage source, the voltage source supplying a periodic voltage having a second frequency, the second frequency being lower than the first frequency, the arrangement of electronic components consisting of a first resistor, a first capacitor, a second resistor, a second capacitor, a third, resistor and at least one third capacitor.

By creating such an arrangement of electronic components, it is advantageously possible to produce modulations or fluctuations of the switching frequency, that is to say the first frequency.

Such fluctuations of the switching frequency or first frequency provoke a spectral spreading or widening of the electromagnetic waves emitted in such a way that the emitted energy is distributed over a wider spectral band, and, consequently, the maximum amplitudes of such electromagnetic waves over the spectral band concerned are reduced compared to a situation without fluctuations. It follows therefrom, that interference effects and notably the coupling of the emitted electromagnetic waves (or radiations) with other electronic components or elements can be reduced.

One element of the invention lies in the fact that the periodic voltage of the voltage source is supplied
   by a microprocessor and/or
   by a programmable circuit (FPGA, field programmable gate array) and/or
   by a logic circuit.

By producing such an arrangement of electronic components, it is advantageously possible to use the arrangement of electronic components according to the present invention in diverse situations and notably with all kinds of switching regulator with an externally set frequency.

According to yet another embodiment of the invention, the first frequency is between 100 kHz and 1 MHz, preferably between 200 kHz and 500 kHz, even more preferably between 300 kHz and 400 kHz, even more preferably 350 kHz.

According to a preferred embodiment of the arrangement of electronic components according to the present invention, the second frequency is between 50 Hz and 10 kHz, preferably between 100 Hz and 5 kHz, even more preferably between 500 Hz and 2 kHz, even more preferably between 900 Hz and 1.1 kHz, Through the flexibility of such an embodiment of the device, it is advantageously possible to produce the fluctuations of the switching frequency—the first frequency—simply and effectively, notably with inexpensive electronic components.

According to another preferred embodiment of the arrangement of electronic components according to the present invention, the periodic voltage is a periodic voltage having a duty cycle of between 20% and 80%, preferably between 40% and 60%, notably 50%.

The present invention also relates to a system, notably for use in a motor vehicle dashboard handset or display, comprising
   a switching regulator,
   an arrangement of electronic components for use with the switching regulator, and
   a voltage source,
the switching regulator comprising a first oscillator having a first frequency, the arrangement of electronic components being linked to the voltage source, the voltage source supplying a periodic voltage having a second frequency, the second frequency being lower than, the first frequency, the arrangement of electronic components consisting of a first resistor, a first capacitor, a second resistor, a second capacitor, a third resistor and at least one third capacitor.

According to a preferred embodiment, of the system according to the present invention, the arrangement of electronic components comprises a fourth capacitor, the fourth capacitor being provided in parallel with the third capacitor. These two capacitors form, just one to set the first frequency of the switching regulator.

Moreover, the present invention also relates to a dashboard handset or display, notably for a motor vehicle, comprising a system comprising
- a switching regulator,
- an arrangement of electronic components for use with the switching regulator, and
- a voltage source, the switching regulator comprising a first oscillator having a first frequency, the arrangement of electronic components being linked to the voltage source, the voltage source supplying a periodic voltage having a second, frequency, the second frequency being lower than the first frequency, the arrangement of electronic components consisting of a first resistor, a first capacitor, a second resistor, a second capacitor, a third resistor and at least one third capacitor.

Other features and advantages of the invention will become apparent on reading the following description of a nonlimiting particular embodiment of the invention.

BRIEF DESCRIPTION OF THE DRAWINGS

The invention will be better understood from the following description, which relates to two preferred embodiments, given as nonlimiting examples, and explained with reference to the appended schematic drawings, in which.

DESCRIPTION OF THE DRAWINGS

Figure 1:
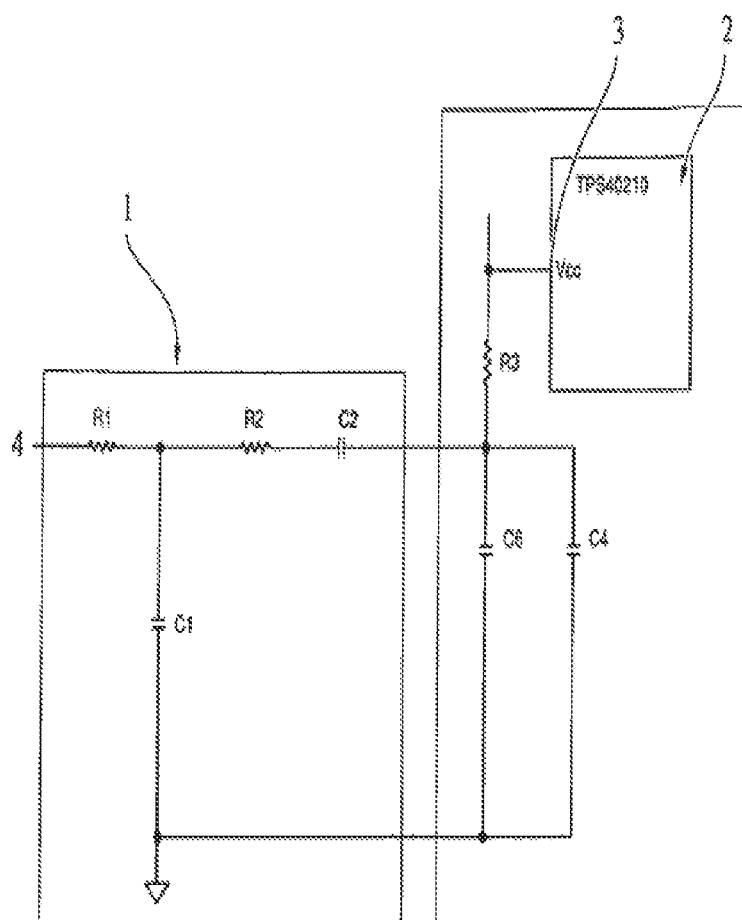
FIG. 1 is a schematic view of the system according to the present invention, comprising an arrangement of electronic components and a switching regulator.

In FIG. 1, a schematic view of the system according to the present invention is represented, comprising an arrangement of electronic components 1 and a switching regulator 2.

It is preferable, according to the present, invention, for the arrangement of electronic components 1 to comprise at least one first resistor and one first capacitor for the generation of a control signal (or pilot signal), that has a trend, over time, of the voltage (of the control signal) in sawtooth form.

FIG. 1 shows a functional diagram, of the arrangement of electronic components 1 which is represented with the switching regulator 2. The arrangement of electronic components 1 is mounted in series with the switching regulator 2 (and positioned before the switching regulator 2).

The switching regulator 2 is, in the example represented, a converter for increasing the voltage and/or the current (boost converter, or step-up regulator), for example a TPS 40210 integrated, circuit from the company Texas Instruments. The switching regulator 2 comprises a first oscillator which is not represented in FIG. 1. The first oscillator supplies a switching frequency (first frequency) to drive a switch of the switching regulator 2. The switching regulator 2 supplies, at its output, an output voltage $U_A$ which, is higher than an input voltage (which is not represented in FIG. 1) which is supplied to the switching regulator 2 as an input.

The switching regulator 2 is used notably to electrically power electrical or electronic components or elements, notably a motor vehicle dashboard handset or display.

In an example according to the present invention, the switching regulator 2 uses a frequency of 350 kHz, or approximately 350 kHz, as first frequency (that is to say switching frequency). The switching regulator 2 is linked to the arrangement, of electronic components 1 according to the present invention via a pin 3.

A voltage source 4 comprises a second oscillator and supplies a control, signal to generate fluctuations intended to vary the first frequency (switching frequency) of the switching regulator 2. The control signal of the voltage source 4 notably has a trend (of the voltage over time) that is rectangular with a second frequency which is lower than the first frequency. The second frequency is, for example, 50 Hz or 1 kHz and has a duty cycle of (for example) 50%. The second oscillator of the voltage source 4 can be integrated or implemented in a control circuit (microcontroller) or in an integrated circuit with a logic circuit.

A first resistor R1 and a first capacitor C1 convert the voltage of the voltage source 4 (notably a rectangular voltage) into a voltage with trend in sawtooth form. In the exemplary embodiment shown in FIG. 1, the first resistor R1 is 4.7 kΩ, and the first capacitor C1 is 220 nF. A second, capacitor C2 eliminates the DC voltage component in the signal from the first resistor R1 and from, the first capacitor C1. In the exemplary embodiment shown in FIG. 1, the second, capacitor C2 is 10 nF. The capacitance of the second capacitor C2 is greater than the sum of the capacitances of a third capacitor C3 and of a fourth capacitor C4. In the exemplary embodiment shown in FIG. 1, the third capacitor C1 is 220 pF, and the fourth capacitor C4 is 22 pF.

A second resistor R2 limits the voltage used to charge the third and fourth capacitors C3, C4 (forming an equivalent capacitor equal to C3+C4 making it possible to set the first, frequency more accurately to 350 kHz). The third capacitor C3 together with the fourth capacitor C4 is linked by a third resistor R3 to the pin 3. In the exemplary embodiment shown in FIG. 1, the third resistor R3 is 200 kΩ. with the arrangement of electronic components 1, fluctuations of approximately 50 kHz are produced around the first frequency (switching frequency) of 350 kHz.

Figure 2:
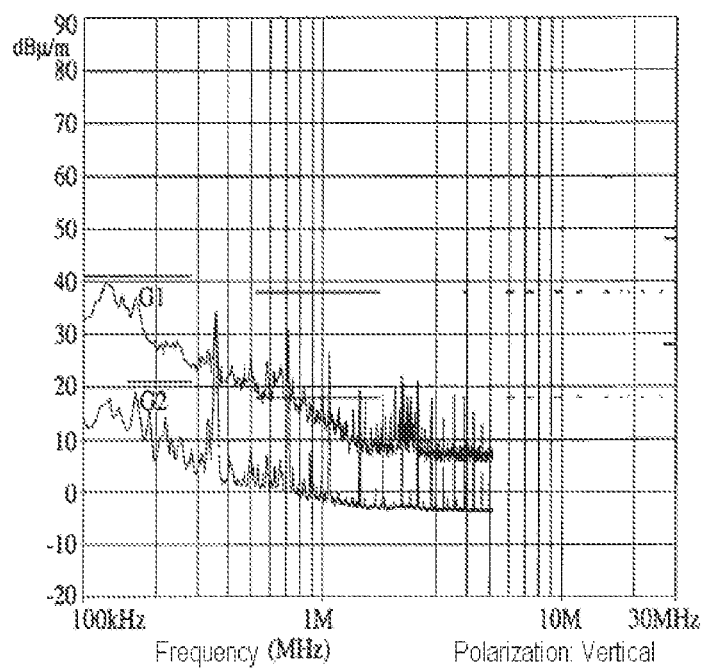
FIG. 2 is a diagram of two measurements conducted with the switching regulator, but, without, the use of the arrangement of electronic components.

FIG. 2 shows, for two different situations, a spectral diagram of the electromagnetic waves emitted by the switching regulator 2 in the situation where the arrangement of electronic components 1 is not present or active. The two different situations are represented by the reference symbols G1 and G2 (which correspond to different input parameters). The diagram shows local maxima of the electromagnetic field emitted at the point of the first frequency (switching frequency) and at the multiple harmonics of this frequency.

Figure 3:
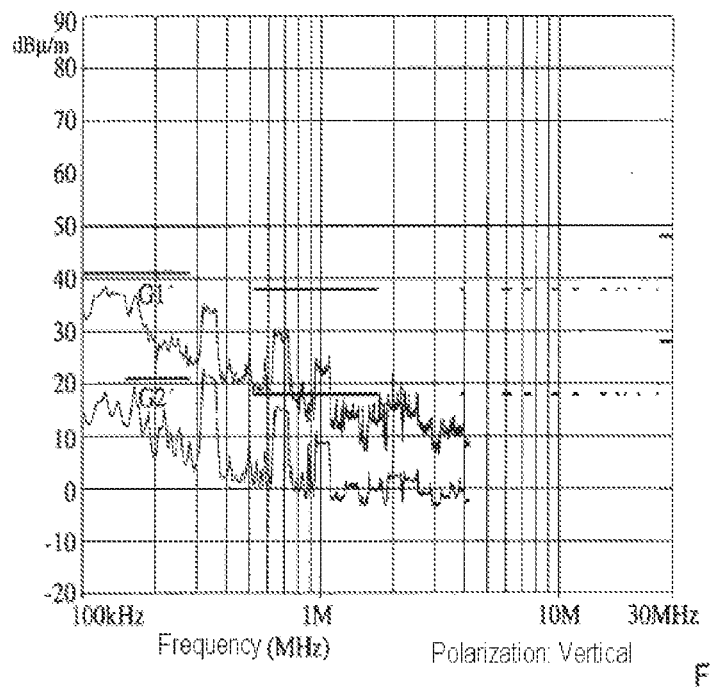
FIG. 3 is a diagram of two measurements conducted with the switching regulator and with the use of the arrangement of electronic components according to the present invention.

FIG. 3 shows, for two different situations, a spectral diagram of the electromagnetic waves emitted by the switching regulator 2 in the situation where the arrangement of electronic components 1 is present and active. The arrangement of electronic components 1 generates fluctuations around the first frequency (switching frequency) of 350 kHz. The fluctuations are spread over a band of approximately 50 kHz. The two different situations are represented by reference symbols G1' and G2' (which correspond to difference input parameters). The diagram shows a trend of the electromagnetic field emitted, at the point, of the first frequency (switching frequency) (as well as at the multiple harmonics of this frequency) which is wider, and, consequently, that has an emitted electromagnetic field that is reduced (by approximately 15 dB compared to the maxima of the curves G1 and G2).

Such a switching regulator 2 is notably used in a motor vehicle dashboard handset, for example to control LEDs or other electrical or electronic components.

The invention claimed is:

1. A system for use with a receiver or display in a vehicle, comprising:
   a switching regulator comprising a first oscillator having a first frequency; and
   a circuit comprising:
      a voltage source supplying a periodic voltage having a second frequency, wherein the second frequency is lower than the first frequency; and
      electronic components designed to be linked to the voltage source,
   wherein the electronic components comprises a first resistor, a first capacitor, a second resistor, a second capacitor, a third resistor, a third capacitor, and at least a fourth capacitor in parallel with the third capacitor, wherein the third and the fourth capacitors produce an equivalent capacitor, wherein the equivalent capacitor is utilized to provide control of the first frequency of the oscillator;
   wherein the first frequency causes emission of electromagnetic waves, wherein the second frequency causes fluctuations in the first frequency, of the oscillator, wherein the fluctuations of the first frequency cause spectral spreading of the electromagnetic waves, reducing the maximum amplitude of any interference or coupling due to the electromagnetic waves.

2. The arrangement of electronic components as claimed in claim 1, wherein the periodic voltage of the voltage source is supplied:
   by a microprocessor and/or
   by a programmable circuit (FPGA, field programmable gate array) and/or by a logic circuit.

3. The arrangement of electronic components as claimed in claim 1, wherein the first frequency is between 100 kHz and 1 MHz.

4. The arrangement of electronic components as claimed in claim 1, wherein the second frequency is between 50 Hz and 10 kHz.

5. The arrangement of electronic components as claimed in claim 1, wherein the periodic voltage is a periodic voltage having a duty cycle of between 20% and 80%.

* * * * *